United States Patent
Yoon

(10) Patent No.: US 9,105,329 B2
(45) Date of Patent: Aug. 11, 2015

(54) GATE DRIVING CIRCUIT AND DISPLAY DEVICE USING THE SAME

(71) Applicant: LG DISPLAY CO., LTD., Seoul (KR)

(72) Inventor: Joongsun Yoon, Paju-si (KR)

(73) Assignee: LG Display Co., Ltd., Seoul (KR)

(*) Notice: Subject to any disclaimer, the term of this patent is extended or adjusted under 35 U.S.C. 154(b) by 146 days.

(21) Appl. No.: 13/708,635

(22) Filed: Dec. 7, 2012

(65) Prior Publication Data
US 2014/0037043 A1    Feb. 6, 2014

(30) Foreign Application Priority Data

Jul. 31, 2012    (KR) .................. 10-2012-0083846

(51) Int. Cl.
G09G 3/36    (2006.01)
G11C 19/00    (2006.01)
G11C 19/28    (2006.01)

(52) U.S. Cl.
CPC .............. *G11C 19/00* (2013.01); *G11C 19/287* (2013.01)

(58) Field of Classification Search
CPC ................................. G09G 2310/0286
USPC ..................... 345/100; 377/61–81; 340/12.21
See application file for complete search history.

(56) References Cited

U.S. PATENT DOCUMENTS

2010/0156862 A1*    6/2010    Kim et al. .................. 345/206
2012/0013588 A1     1/2012    Chung

* cited by examiner

*Primary Examiner* — Aneeta Yodichkas
*Assistant Examiner* — Brent D Castiaux
(74) *Attorney, Agent, or Firm* — Birch, Stewart, Kolasch & Birch, LLP

(57) ABSTRACT

An embodiments herein relate to a gate driving circuit and display device which include a plurality of shift registers. The gate driving circuit comprises: a plurality of shift registers, wherein each of the shift registers includes a plurality of stages which sequentially output a gate signal, wherein the stages of a kth shift register are activated when a kth SR selection signal generated as a first logic level voltage is input, and the stages of the kth shift register are not activated when the kth SR selection signal generated as a second logic level voltage is input, wherein k is a natural number equal to or less than the number of the shift registers.

18 Claims, 6 Drawing Sheets

GATE DRIVING CIRCUIT AND DISPLAY DEVICE USING THE SAME

CROSS-REFERENCE TO RELATED APPLICATION

This application claims priority under 35 U.S.C. §119(a) of Korean Patent Application No. 10-2012-0083846, filed on Jul. 31, 2012, which is incorporated by reference in its entirety.

BACKGROUND

1. Technical Field

The following description relates to a gate driving circuit and display device which includes a plurality of shift registers.

2. Discussion of the Related Art

There has been an increasing demand for a display device for displaying an image together with the growth of an information-oriented society. Recently, various flat panel displays which reduce weight and volume corresponding to an advantage of a cathode ray tube are developed. For example, the various flat panel displays such as liquid crystal displays (LCDs), plasma display panels (PDPs), and organic light emitting diodes (OLEDs) have been widely used in recent years The flat panel display displays an image by using a gate driving circuit which sequentially supplies gate signal to gate lines of a display panel, and a data driving circuit which supplies data voltages to data lines of the display panel. The gate driving circuit is implemented by a TAB (tape automated bonding) method which attaches printed circuit board mounted a gate drive integrated circuit (IC) to the display panel, or a GIP (gate drive IC in panel) method which forms the gate drive IC on the display panel. The flat panel display can be slim when the gate driving circuit is implemented by the GIP method. Thus, a manufacturing firm may design an appearance of the flat panel display by considering the beauty. Also, a display panel maker may lay out the gate signal and a cost of fabricating the display panel may be reduced when the gate driving circuit is implemented by the GIP method.

Meanwhile, a complexity of the gate signals may be increased for improving a picture quality. For example, the gate driving circuit includes a plurality of shift registers which generate a plurality of gate signals. The gate driving circuit needs a multiplexer for selecting any one gate signal among the plurality of gate signals generated from the plurality of shift registers. The gate driving circuit sequentially supplies the selected gate signal by the multiplexer to the gate lines.

However, a size of the multiplexer should be greater than a buffer size of the shift register in order that the multiplexer pass on the gate signal to the gate line without a loss of the gate signal. A layout area of the gate driving circuit gets bigger as the size of the multiplexer is greater. Also, a bezel area of the display device becomes wider. The bezel area is a side of the display device. The image is not displayed on the bezel area corresponding to a non-display area. The gate driving circuit is formed on the bezel area when the gate driving circuit is implemented by the GIP method.

Also, a switching element of the multiplexer may be deteriorated if the multiplexer is driven for a long time. The deterioration of the switching element causes a loss of output of the multiplexer.

SUMMARY

One object of the embodiments of this application provides a gate driving circuit and a display device using the same which selects any one of a plurality of gate signals generated from a plurality of shift registers without a multiplexer and sequentially supplies a selected gate signal to gate lines, wherein frequencies of the gate signals generated from the shift registers are different from each other.

To achieve these objects and other advantages and in accordance with the purpose according to one aspect of the invention, a gate driving circuit comprising: a plurality of shift registers, wherein each of the shift registers configured to include a plurality of stages which sequentially output gate signal, wherein the stages of a kth shift register is activated when a kth SR selection signal generated as a first logic level voltage is input, and the stages of the kth shift register is not activated when the kth SR selection signal generated as a second logic level voltage is input, wherein k is a natural number equal to or less than the number of the shift registers.

In another aspect, a display device comprising: a display panel configured to include data lines and gate lines; a data driving circuit configured to supply data voltages to the data lines; and a gate driving circuit configured to sequentially supply a gate signal to the gate lines, wherein the gate driving circuit configured to include a plurality of shift registers, wherein each of the shift registers configured to include a plurality of stages which sequentially output gate signal, wherein the stages of a kth shift register is activated when a kth SR selection signal generated as a first logic level voltage is input, and the stages of the kth shift register is not activated when the kth SR selection signal generated as a second logic level voltage is input, wherein k is a natural number equal to or less than the number of the shift registers.

The features and advantages described in this summary and the following detailed description are not intended to be limiting. Many additional features and advantages will be apparent to one of ordinary skill in the art in view of the drawings, specification and claims.

DETAILED DESCRIPTION

Figure 1:
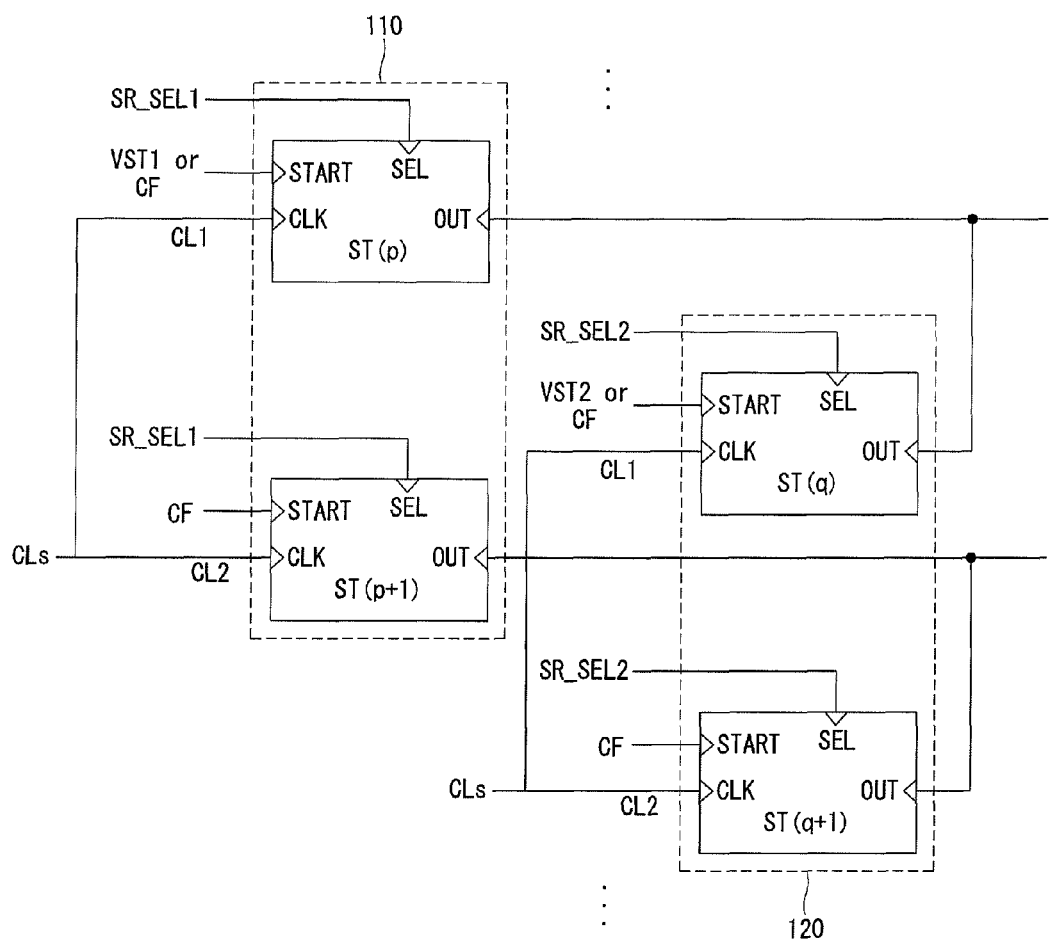
FIG. 1 illustrates a gate driving circuit according to an exemplary embodiment of the present invention.

The invention will be described more fully hereinafter with reference to the accompanying drawings, in which example embodiments of the inventions are shown. This invention may, however, be embodied in many different forms and should not be construed as limited to the embodiments set forth herein. Like reference numerals designate like elements throughout the specification. In the following description, if it is decided that the detailed description of known function or configuration related to the invention makes the subject matter of the invention unclear, the detailed description is omitted.

FIG. 1 illustrates a gate driving circuit according to an exemplary embodiment of the present invention. With reference to FIG. 1, the gate driving circuit according to the exemplary embodiment comprises a plurality of shift registers. In FIG. 1, the gate driving circuit comprises two shift registers; a first shift register 110 and a second shift register 120 for convenience of description.

Each of the shift registers includes a plurality of stages which sequentially output a gate signal by a cascade joint. For example, the first shift register 110 has a plurality of stages which sequentially output a first gate signal by the cascade joint as shown in FIG. 1. Also, the second sift register 120 has a plurality of stages which sequentially output a second gate signal by the cascade joint as shown in FIG. 1. A pth stage ST(p) and a (p+1)th stage ST(p+1) of the first shift register 110, and a qth stage ST(q) and a (q+1)th stage ST(q+1) of the second shift register 120 are shown in FIG. 1 for convenience of description, wherein 'p' is a natural number less than the number of stages of the first shift register 110 and 'q' is a natural number less than the number of stages of the second shift register 120.

Each stage of a kth shift register control terminals which control signals are supplied to and an output terminal OUT, wherein 'k' is a natural number equal to or less than the number of shift registers. The control terminals include a start terminal START, a clock terminal CLK, a selection terminal SEL, and so on. The output terminal OUT is coupled to a gate line of a display panel. An output of each stage is supplied to the gate line through the output terminal OUT.

A start signal is input to the start terminal START. The start signal may be a first start voltage VST1, a second start voltage VST2, or a carry signal CF from a front stage. The front stage is referred to as a stage positioned in front of a base stage. For example, when the pth stage is a base stage, the front stage indicates one of a first stage to a (p−1)th stage. Also, when the qth stage is a base stage, the front stage indicates one of a first stage to a (q−1)th stage. Each stage of the kth shift register outputs a gate high voltage in response to the start signal through the start terminal START. The gate high voltage indicates a voltage for turning on a scan TFT of the display panel. For example, each stage of the first shift register 110 outputs the gate high voltage the first gate signal in response to the first start voltage VST1 or the carry signal CF from the front stage through the start terminal START. Each stage of the second shift register 120 outputs the gate high voltage in response to the second start voltage VST2 or the carry signal CF from the front stage through the start terminal START. The carry signal CF from the front stage may be the output signal from the output terminal of the front stage.

One of clock signals CLs is input to the clock terminal CLK. The clock signals CLs may be i-phase clock signals, where 'i' is a natural number equal to or greater than 2. Each stage of the kth shift register includes one clock terminal. The clock signals CLs may be input to the stages of the kth shift register by turns. For example, when a first clock signal CL1 is input to the clock terminal CLK of pth stage ST(p) or qth stage ST(q) and a second clock CL2 is input to the clock terminal CLK of (p+1)th stage ST(p+1) or (q+1)th stage ST(q+1). Meanwhile, the clock signals input to the stages of the first shift register 110 may be same or different from the clock signals input to the stages of the second shift register 120.

In FIG. 1, each stage of the kth shift register includes one clock terminal for convenience of description. However, each stage of the kth shift register may include a plurality of clock terminals. In this case, a number of clock signals CLs may be input to stages of the kth shift register through the plurality of clock terminals by turns. For example, when a first clock is input to a first clock terminal of pth stage ST(p) or qth stage ST(q) and a second clock is input to a second clock terminal thereof, the first clock is input to the second clock terminal of (p+1)th stage ST(p+1) or qth stage ST(q+1) and the second clock is input to the first clock terminal thereof.

Any one of the SR selection signals is input to the selection terminal SEL. Any one of two SR selection signals SR_SEL1, SR_SEL2 is input to the selection terminal SEL when the gate driving circuit includes two shift registers 110, 120 as shown in FIG. 1. More specifically, a kth SR selection signal is input to the selection terminal SEL of each stage of the kth shift register. For example, a first SR selection signal SR_SEL1 is input to the selection terminal SEL of each stage of the first shift register 110. Also, a second SR selection signal SR_SEL2 is input to the selection terminal SEL of each stage of the second shift register 120.

Each SR selection signal is generated as a first logic level voltage or a second logic level voltage. The stages of the kth shift register are activated when the kth SR selection signal generated as the first logic level voltage is input, and the stages of the kth shift register is not activated when the kth SR selection signal generated as the second logic level voltage. For example, the stages of the first shift register 110 may be activated and sequentially output the first gate signal in response to the first SR selection signal SR_SEL1 generated as the first logic level voltage. Also, the stages of the first shift register 110 may not be activated in response to the first SR selection signal SR_SEL1 generated as the second logic level voltage. The stages of the second shift register 120 may be activated and sequentially output the second gate signal in response to the second SR selection signal SR_SEL2 generated as the first logic level voltage. Also, the stages of the second shift register 120 may not be activated in response to the second SR selection signal SR_SEL2 generated as the second logic level voltage. The first logic level voltage may be a gate low voltage, and the second logic level voltage may be a gate high voltage higher than the gate low voltage. The SR selection signals are described in detail with reference to FIG. 5.

In FIG. 1, the control terminals include the start terminal START, the clock terminal CLK, and the selection terminal SEL for convenience of description, but the control terminals are not limited thereto. The control terminals may further include a reset terminal (not shown) which a reset signal is input to. In this case, each stage of the kth shift register may be reset in response to the reset signal. Meanwhile, each of the shift registers according to the exemplary embodiment may be implemented as any formation which is already known in public.

Figure 2:
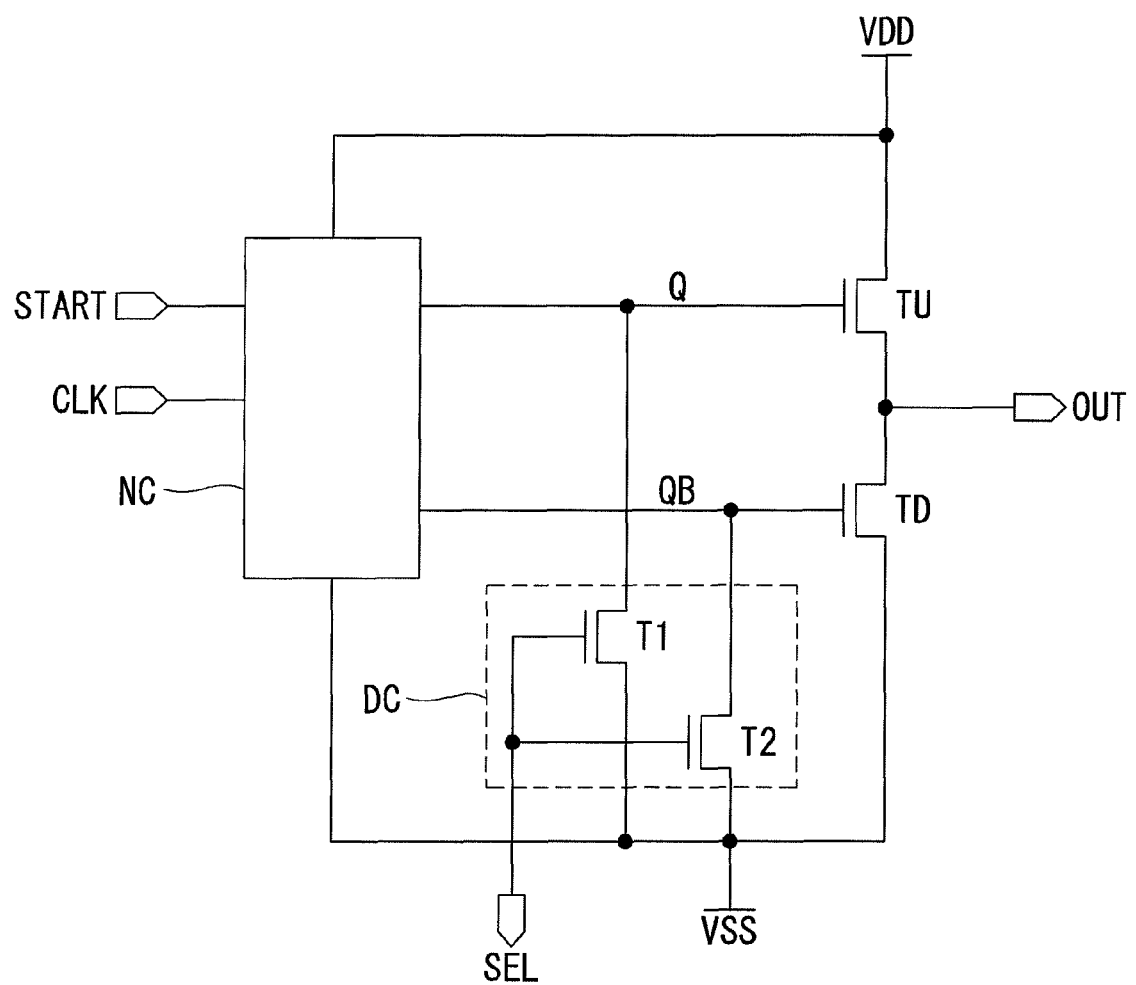
FIG. 2 illustrates a circuit diagram of each stage of a kth shift register.

FIG. 2 illustrates a circuit diagram of each stage of a kth shift register. With reference to FIG. 2, each stage of the kth shift register includes a Q node Q, a QB node QB, a pull-up TFT TU, a pull-down TFT TD, a node control circuit NC, a discharge control circuit DC, and the like.

The pull-up TFT TU is turned on and off depending on a Q node voltage (a voltage at the Q node Q), and outputs a gate high voltage by turn-on. The gate high voltage may be the high supply voltage VDD. The pull-up TFT TU is turned on in response to the high supply voltage VDD at the Q node Q. A gate electrode of the pull-up TFT TU is coupled to the Q node Q, a source electrode thereof is coupled to the output terminal OUT, and a drain electrode thereof is coupled to a high voltage supply source supplying the gate high voltage (or the high supply voltage VDD). The pull-down TFT TD is turned on and off depending on a QB node voltage (a voltage at the QB node QB), and outputs a gate low voltage by turn-on. The gate low voltage may be the low supply voltage. The pull-down TFT TD is turned on in response to the high supply voltage VDD at the QB node QB. A gate electrode of the pull-down TFT TD is coupled to the QB node QB, a source electrode thereof is coupled to a low voltage supply source supplying the gate low voltage (or the low supply voltage), and a drain electrode thereof is coupled to the output terminal OUT.

The node control circuit NC controls the Q node voltage and the QB node voltage to the high supply voltage VDD or the low supply voltage VSS in response to control signals input through control terminals. The node control circuit NC may charge the Q node voltage to the high supply voltage VDD and discharge the QB node voltage to the low supply voltage VSS in response to the start signal input through the start terminal START. Also, the node control circuit NC uses the clock signal input through the clock terminal CLK as a signal for controlling itself. For example, the node control circuit NC the clock signal as the output signal when the pull-up TFT is turned on. Or, the node control circuit NC may charge the QB node voltage to the high supply voltage VDD and discharge the Q node voltage to the low supply voltage VSS in response to the start signal.

The discharge control circuit DC discharges the Q node voltage and the QB node voltage to the low supply voltage VSS in response to the kth SR selection signal generated as the second logic level voltage. The discharge control circuit DC discharges the Q node voltage and the QB node voltage to the low supply voltage VSS regardless of the node control circuit NC, thus stages of the kth shift register may be non-activated.

The discharge control circuit DC may include a first TFT T1 and a second TFT T2. The first TFT T1 is turned on in response to the kth SR selection signal generated as the second logic level voltage, and the Q node voltage is discharged to the low supply voltage VSS regardless of operation of the node control circuit NC. The first TFT T1 is turned off in response to the kth SR selection signal generated as the first logic level voltage, and the Q node Q is controlled by the node control circuit NC. A gate electrode of the first TFT T1 is coupled to the selection terminal SEL, a source electrode thereof is coupled to the low supply voltage source, and a drain electrode thereof is coupled to Q node Q. The second TFT T2 is turned on in response to the kth SR selection signal generated as the second logic level voltage, and the QB node voltage is discharged to the low supply voltage VSS regardless of operation of the node control circuit NC. The second TFT T2 is turned off in response to the kth SR selection signal generated as the first logic level voltage, and the QB node QB is controlled by the node control circuit NC. A gate electrode of the second TFT T2 is coupled to the selection terminal SEL, a source electrode thereof is coupled to the low supply voltage source, and a drain electrode thereof is coupled to QB node QB.

In FIG. 2, the pull-up TFT TU, the pull-down TFT TD, the first TFT T1, and the second TFT are implemented as N-type transistors, but are not limited thereto. The pull-up TFT TU, the pull-down TFT TD, the first TFT T1, and the second TFT may be implemented as P-type transistors, or switch elements known in public.

As described herein, the Q node Q and the QB node QB are controlled by the node control circuit NC because the first TFT T1 and the second TFT T2 are turned off when the kth SR selection signal is generated as the first logic level. That is, each stage of the kth shift register is normally operated, and it indicates the kth shift register is activated. However, the Q node Q and the QB node QB are discharged to the low supply voltage VSS regardless of the node control circuit NC because the first TFT T1 and the second TFT T2 are turned on when the kth SR selection signal is generated as the second logic level. That is, each stage of the kth shift register is not normally operated, and it indicates the kth shift register is not activated.

Meanwhile, impedance of the output terminal OUT of each stage of the shift register(s) which is(are) not activated is much higher than the impedance of the output terminal OUT of each stage of the shift register(s) which is(are) activated. Therefore, the shift register which is activated may output the gate signal stably without interference of the shift register which is not activated. The gate driving circuit including the shift registers according to the exemplary embodiment select any one of a plurality of gate signals generated from a plurality of shift registers without a multiplexer and sequentially supply a selected gate signal to gate lines, wherein frequencies of the gate signals generated from the shift registers are different from each other. Therefore, the exemplary embodiment may decrease a bezel area of the display device by decreasing a layout area of the gate driving circuit, wherein the bezel area is a side of the display device, and the image is not displayed on the bezel area corresponding to a non-display area. The gate driving circuit is formed on the bezel area when the gate driving circuit is implemented by the GIP (gate drive IC in panel) method.

Figure 3:
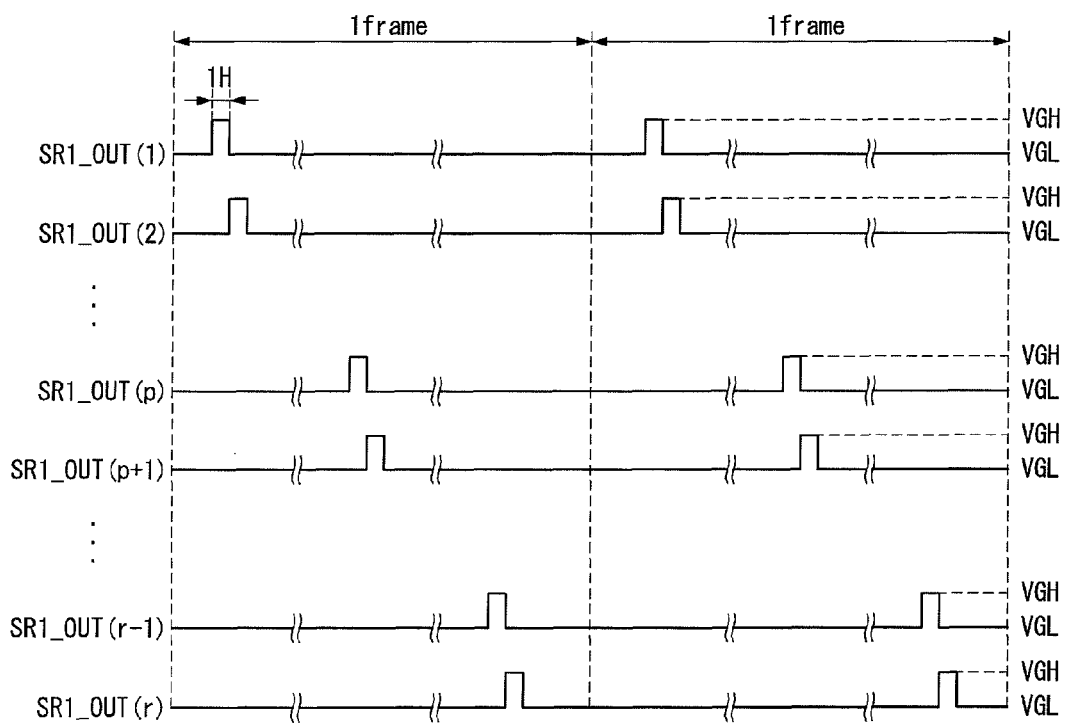
FIG. 3 illustrates a waveform diagram showing an example of signals output from a first shift register.
Figure 4:
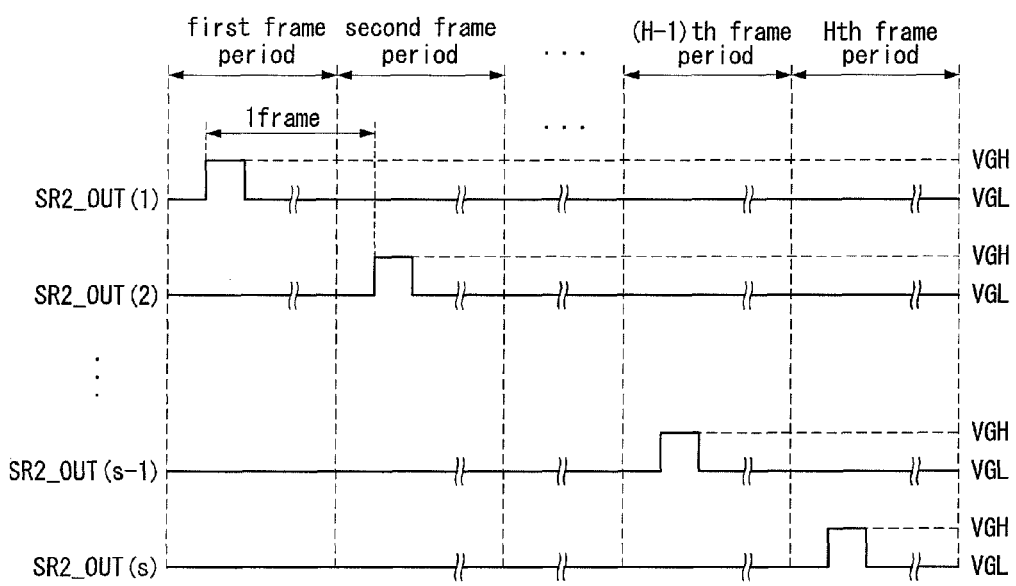
FIG. 4 illustrates a waveform diagram showing an example of signals output from a second shift register.

FIG. 3 illustrates a waveform diagram showing an example of signals output from a first shift register. FIG. 4 illustrates a waveform diagram showing an example of signals output from a second shift register. Frequencies of the plurality of gate signals may be different from each other. That is, frequency of the first gate signal generated from the first shift register 110 is different from frequency of the second gate signal generated from the second shift register 120 as shown in FIGS. 3 and 4. In FIG. 3, the first gate signal generated from the first shift register 110 has a cycle of one frame period. In FIG. 4, the second gate signal generated from the second shift register 120 has a cycle of H frame periods, wherein 'H' is a natural number greater than 2. However, the frequencies of the first shift register 110 and the second shift register are not limited to description of FIGS. 3 and 4.

With reference to FIG. 3, the first gate signal generated from the first shift register 110 has a cycle of one frame period. The first gate signal includes first to rth output signals SR1_OUT1~SR1_OUTr when the first shift register 110 has r stages, wherein 'r' is a natural number equal to or less than the number of the stages of the first shift register 110. The first shift register 110 sequentially outputs the first to rth output signals SR1_OUT1~SR1_OUTr during one frame period. The first to rth output signals SR1_OUT1~SR1_OUTr may be swung between the gate low voltage VGL and the gate high voltage VGH. The first to rth output signals SR1_OUT1~SR1_OUTr may be sequentially shifted every one horizontal period 1H. For example, the second output signal SR1_OUT2 of the first shift register 110 may be shifted as one horizontal period 1H as the first output signal SR1_OUT1 thereof as shown in FIG. 3. One horizontal period 1H is referred to as one line scanning period for which data voltages from a data driving circuit are supplied to pixels on one horizontal line. One frame period is referred to as a period for which supplies the data voltages from the data driving circuit are supplied to all pixels of the display panel.

With reference to FIG. 4, the second gate signal generated from the second shift register 120 has a cycle of H frame periods. The second gate signal includes first to sth output signals SR2_OUT1~SR2_OUTs when the first shift register 110 has s stages, wherein 's' is a natural number equal to or less than the number of the stages of the second shift register

120. The second shift register 120 sequentially outputs the first to sth output signals SR2_OUT1~SR2_OUTs during H frame periods. The first to sth output signals SR2_OUT1~SR2_OUTs may be swung between the gate low voltage VGL and the gate high voltage VGH. The first to sth output signals SR2_OUT1~SR2_OUTs may be sequentially shifted every one frame period. For example, the second output signal SR2_OUT2 of the second shift register 120 may be shifted as one frame period as the first output signal SR2_OUT1 thereof as shown in FIG. 4.

Figure 5:
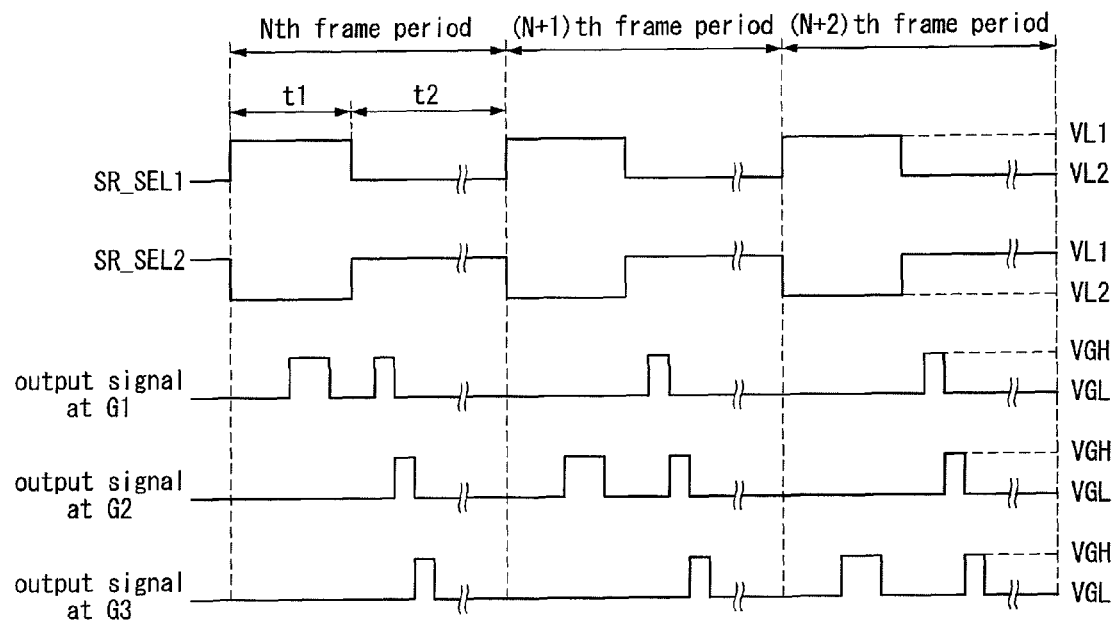
FIG. 5 illustrates a waveform diagram showing an example of a first SR selection signal, a second SR selection signal, and an output signal from a gate driving circuit.

FIG. 5 illustrates a waveform diagram showing an example of a first SR selection signal, a second SR selection signal, and an output signal from a gate driving circuit. The first SR selection signal SR_SEL1 is input to the first shift register 110 for controlling the discharge control circuit DC of the first shift register 110. The second SR selection signal SR_SEL2 is input to the second shift register 120 for controlling the discharge control circuit DC of the second shift register 120. The first SR selection signal SR_SEL1 and the second SR selection signal SR_SEL2 in FIG. 5 are an exemplary embodiment, so are not limited thereto.

With reference to FIG. 5, only one of SR selection signals may be generated as the first logic level voltage VL1 during a predetermined period. The rest of SR selection signals may be generated as the second logic level voltage VL2 during the predetermined period. That is, only one of the shift registers may be activated during the predetermined period, and the rest of the shift registers may be not activated during the predetermined period. Therefore, the shift register which is activated may be operated stably regardless of interference of the shift registers which are not activated.

For example, as shown in FIG. 5, the first SR selection signal SR_SEL1 is generated as the second logic level voltage VL2 during a first period t1, and the first logic level voltage VL1 during a second period t2 every frame. The second SR selection signal SR_SEL2 is generated as the first logic level voltage VL1 during the first period t1, and the second logic level voltage VL2 during the second period t2 every frame. Accordingly, the second shift register 120 outputs the second gate signal during the first period t1, and the first gate signal during the second period t2 every frame.

More specifically, the first SR selection signal SR_SEL1 is generated as the second logic level voltage VL2 and the second SR selection signal SR_SEL2 is generated as the first logic level voltage VL1 during the first period t1 of a N frame period, wherein N is a natural number. Thus, the second shift register 120 is only activated during the first period t1 of the N frame period. Therefore, the first output signal SR2_OUT1 of the second shift register 120 in FIG. 4 is output to the first gate line G1 during the first period t1 of the N frame period in FIG. 5. Also, the second output signal SR2_OUT2 of the second shift register 120 in FIG. 4 is output to the second gate line G2 during the first period t1 of the N frame period in FIG. 5. Furthermore, the third output signal to the sth output signals SR2_OUT3~SR2_OUTs of the second shift register 120 may be output to the third to sth gate lines during the first period t1 of the N frame period.

The first SR selection signal SR_SEL1 is generated as the first logic level voltage VL1 and the second SR selection signal SR_SEL2 is generated as the second logic level voltage VL2 during the second period t2 of the N frame period. Thus, the first shift register 110 is only activated during the second period t2 of the N frame period. Therefore, the first output signal SR1_OUT1 of the first shift register 110 in FIG. 4 is output to the first gate line G1 during the second period t2 of the N frame period in FIG. 5. Also, the second output signal SR1_OUT2 of the first shift register 110 in FIG. 4 is output to the second gate line G2 during the second period t2 of the N frame period in FIG. 5. Furthermore, the third output signal to the rth output signals SR1_OUT3~SR1_OUTs of the first shift register 120 may be output to the third to rth gate lines during the second period t2 of the N frame period.

The output of the gate driving circuit during (N+1)th frame period and a (N+2)th frame period is as same as the output of the gate driving circuit during Nth frame period. Therefore, the description of the output of the gate driving circuit during (N+1)th frame period and a (N+2)th frame period is omitted.

As described herein, the gate driving circuit according to the exemplary embodiment outputs the second gate signal generated from the second shift register 120 during the first period t1 every frame, and the first gate signal generated from the first shift register 110 during the second period t2 every frame. That is, the gate driving circuit according to the exemplary embodiment selects any one of the gate signals without a multiplexer and sequentially supplies a selected gate signal to gate lines, wherein frequencies of gate signals are different from each other.

Figure 6:
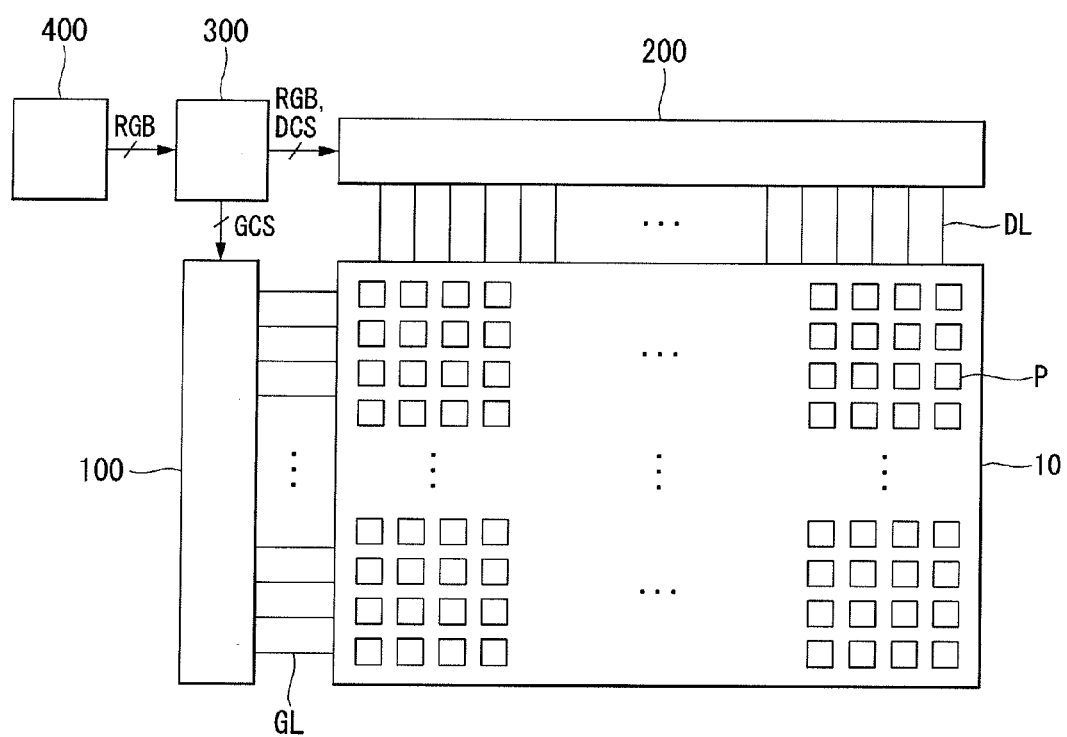
FIG. 6 illustrates a block diagram schematically showing a display device according to an exemplary embodiment of the present invention.

FIG. 6 illustrates a block diagram schematically showing a display device according to an exemplary embodiment of the present invention. Referring to FIG. 6, the display device according to the exemplary embodiment comprises a display panel 10, a gate driving circuit 100, a data driving circuit 200, a timing controller 300, and a host system 400. The display device according to the example embodiment of the present invention may be implemented as a flat panel display such as a liquid crystal display (LCD), a field emission display (FED), a plasma display panel (PDP), and an organic light emitting diode (OLED) display. In the following description, the example embodiment of the invention describes the organic light emitting diode display as an example of the display device. Other kinds of flat panel displays may be used.

The display panel 10 has data lines DL and gate lines GL crossing each other. The display panel 10 comprises a pixel array having pixels P disposed in a matrix form in. Each pixel P of the display panel 10 may include at least one switching TFT, a driving TFT, an organic light emitting diode, and at least one capacitor. The pixels may be implemented by any known structure. Each pixel is connected to the data line DL and the gate line GL through the switching TFT. Each pixel receives a data voltage from the data driving circuit 200 through the data line DL and receives a gate signal from the gate driving circuit 100 through the gate line GL. Each pixel emits a light by controlling a current flowing to the organic light emitting diode by using the switching TFT and the driving TFT. The display panel 10 is implemented as a bottom emission structure or a top emission structure according to a pixel structure.

The data driving circuit 200 comprises a plurality of source drive ICs. The source drive ICs receive digital video data RGB from the timing controller 300. The source drive ICs convert the digital video data RGB into gamma correction voltages to generate data voltages, in response to data timing control signals DCS from the timing controller 300. And then, the source drive ICs supply the data voltages to the data lines DL of the display panel 10 in synchronization with the gate signal from the gate driving circuit 100.

The gate driving circuit 100 sequentially supplies the gate signal to the gate lines GL for controlling the switching TFT, in response to gate timing control signals GCS from the timing controller 300. The gate driving circuit 100 further includes a level shifter which level-shifts output signal of the shift register to a voltage having a swing width for driving the switching TFT, and an output buffer. A detailed description of the shift registers was previously described by reference to FIGS. 1 to 5. The gate driving circuit 100 may be directly formed on the lower substrate of the display panel 200 through a gate-in-panel (GIP) method. Or, the gate driving circuit 100 may be mounted on a tape carrier package (TCP) and connected to the gate lines GL of the display panel 10 through a tape automated bonding (TAB) method. In the GIP method, a level shifter may be mounted on a printed circuit board (PCB).

The timing controller 300 receives the digital video data RGB from the host system 400 via an interface such as an LVDS (low voltage differential signaling) interface, a TMDS (transition minimized differential signaling) interface or the like. The timing controller 300 transmits the digital video data RGB input from the host system 400 to the data driving circuit 20.

The timing controller 300 receives timing signals such as a vertical synchronization signal, a horizontal synchronization signal, a data enable signal, a main clock, and so forth from the host system 400. The timing controller 300 generates timing control signals for controlling operation timings of the data driving circuit 200 and the gate driving circuit 100 based on the timing signals from the host system 400. The timing control signals comprise gate timing control signals GCS for controlling operation timings of the gate driving circuit 100, and data timing signals DCS for controlling operation timings of the data driving circuit 200. The gate timing control signals GCS may include a start signal, clock signals, and SR selection signals. The start signal may have a first start voltage and a second start voltage. The number of the SR selection signals is same as the number of the shift registers.

The host system 400 includes a system on chip having a scaler therein and converts digital video data RGB input from an external video source device to a data format of a resolution appropriate for displaying in the display panel 10. The host system 400 transmits the digital video data RGB and timing signals to the timing controller 300.

The embodiments described herein selects any one of a plurality of gate signals generated from a plurality of shift registers without a multiplexer and sequentially supplies a selected gate signal to gate lines, wherein frequencies of the gate signals generated from the shift registers are different from each other. Therefore, the embodiments described herein may decrease a bezel area of the display device by decreasing a layout area of the gate driving circuit, wherein the bezel area indicates a side of the display device, and the image is not displayed on the bezel area corresponding to a non-display area.

Although the embodiments of this application have been described with reference to a number of illustrative embodiments thereof, it should be understood that numerous other modifications and embodiments of this application can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A gate driving circuit comprising:
a plurality of shift registers,
wherein each of the shift registers includes a plurality of stages which sequentially output a gate signal,
wherein the stages of a kth shift register are activated when a kth SR selection signal generated as a first logic level voltage is input, and the stages of the kth shift register are not activated when the kth SR selection signal generated as a second logic level voltage is input, wherein k is a natural number equal to or less than the number of the shift registers, and
wherein each stage of the kth shift register includes:
a pull-up TFT configured to turn on and off depending on a Q node voltage, and output a gate high voltage by turn-on;
a pull-down TFT configured to turn on and off depending on a QB node voltage, and output a gate low voltage by turn-on;
a node control circuit configured to control the Q node voltage and the QB node voltage to a high supply voltage or a low supply voltage; and
a discharge control circuit having a first TFT and a second TFT, the first TFT and the second TFT being configured to discharge the Q node voltage and the QB node voltage, respectively, in response to the second logic level of the kth SR selection signal.

2. The gate driving circuit of claim 1, wherein the pull-up TFT and the pull-down TFT are turned on in response to the high supply voltage of a Q node and a QB node, and turned off in response to the low supply voltage of the Q node and the QB node.

3. The gate driving circuit of claim 1, wherein frequencies of gate signals generated from the shift registers are different from each other.

4. The gate driving circuit of claim 1, wherein only one of the SR selection signals is generated as the first logic level voltage during a predetermined period.

5. The gate driving circuit of claim 1, wherein the first logic level voltage is a gate low voltage, and the second logic level voltage is a gate high voltage higher than the gate low voltage.

6. The gate driving circuit of claim 1, wherein the discharge control circuit discharges the Q node voltage and the QB node voltage to the low supply voltage regardless of the node control circuit.

7. The gate driving circuit of claim 1, wherein an impedance of an output terminal of the each stage of the kth shift register which is not activated is higher than an impedance of an output terminal of the each stage of the kth shift register which is activated.

8. A gate driving circuit comprising:
a plurality of shift registers,
wherein each of the shift registers includes a plurality of stages which sequentially output a gate signal,
wherein the stages of a kth shift register are activated when a kth SR selection signal generated as a first logic level voltage is input, and the stages of the kth shift register are not activated when the kth SR selection signal generated as a second logic level voltage is input, wherein k is a natural number equal to or less than the number of the shift registers,
wherein each stage of the kth shift register includes:
a pull-up TFT configured to turn on and off depending on a Q node voltage, and output a gate high voltage by turn-on;
a pull-down TFT configured to turn on and off depending on a QB node voltage, and output a gate low voltage by turn-on;
a node control circuit configured to control the Q node voltage and the QB node voltage to a high supply voltage or a low supply voltage; and
a discharge control circuit configured to discharge the Q node voltage and the QB node voltage in response to the second logic level of the kth SR selection signal, wherein the pull-up TFT and the pull-down TFT are turned on in response to the high supply voltage of a Q node and a QB node, and turned off in response to the low supply voltage of the Q node and the QB node, and wherein the discharge control circuit includes:

a first TFT configured to discharge the Q node voltage to the low supply voltage in response to the second logic level of the kth SR selection signal; and a second TFT configured to discharge the QB node voltage to the low supply voltage in response to the second logic level of the kth SR selection signal.

9. The gate driving circuit of claim 8, wherein a gate electrode of the first TFT is coupled to a SR selection signal input terminal which the kth SR selection signal is input to, a source electrode thereof is coupled to a low supply voltage terminal which the low supply voltage is supplied to, a drain electrode thereof is coupled to a Q node, and wherein a gate electrode of the second TFT is coupled to the SR selection signal input terminal, a source electrode thereof is coupled to the low supply voltage terminal, a drain electrode thereof is coupled to a QB node.

10. A display device comprising:

a display panel configured to include data lines and gate lines;

a data driving circuit configured to supply data voltages to the data lines; and a gate driving circuit configured to sequentially supply a gate signal to the gate lines, wherein the gate driving circuit includes a plurality of shift registers, wherein each of the shift registers includes a plurality of stages which sequentially output gate signal, wherein the stages of a kth shift register are activated when a kth SR selection signal generated as a first logic level voltage is input, and the stages of the kth shift register are not activated when the kth SR selection signal generated as a second logic level voltage is input, wherein k is a natural number equal to or less than the number of the shift registers, and wherein each stage of the kth shift register includes:

a pull-up TFT configured to turn on and off depending on a Q node voltage, and output a gate high voltage by turn-on;

a pull-down TFT configured to turn on and off depending on a QB node voltage, and output a gate low voltage by turn-on;

a node control circuit configured to control the Q node voltage and the QB node voltage to a high supply voltage or a low supply voltage; and a discharge control circuit having a first TFT and a second TFT, the first TFT and the second TFT being configured to discharge the Q node voltage and the QB node voltage, respectively, in response to the second logic level of the kth SR selection signal.

11. The display device of claim 10, wherein the pull-up TFT and the pull-down TFT are turned on in response to the high supply voltage of a Q node and a QB node, and turned off in response to the low supply voltage of the Q node and the QB node.

12. The display device of claim 10, wherein frequencies of gate signals generated from the shift registers are different from each other.

13. The display device of claim 10, wherein only one of the SR selection signals is generated as the first logic level voltage during a predetermined period.

14. The display device of claim 10, wherein the first logic level voltage is a gate low voltage, and the second logic level voltage is a gate high voltage higher than the gate low voltage.

15. The display device of claim 10, wherein the discharge control circuit discharges the Q node voltage and the QB node voltage to the low supply voltage regardless of the node control circuit.

16. The display device of claim 10, wherein an impedance of an output terminal of the each stage of the kth shift register which is not activated is higher than an impedance of an output terminal of the each stage of the kth shift register which is activated.

17. A display device comprising:

a display panel configured to include data lines and gate lines;

a data driving circuit configured to supply data voltages to the data lines; and a gate driving circuit configured to sequentially supply a gate signal to the gate lines, wherein the gate driving circuit includes a plurality of shift registers, wherein each of the shift registers includes a plurality of stages which sequentially output gate signal, wherein the stages of a kth shift register are activated when a kth SR selection signal generated as a first logic level voltage is input, and the stages of the kth shift register are not activated when the kth SR selection signal generated as a second logic level voltage is input, wherein k is a natural number equal to or less than the number of the shift registers, and wherein each stage of the kth shift register includes:

a pull-up TFT configured to turn on and off depending on a Q node voltage, and output a gate high voltage by turn-on;

a pull-down TFT configured to turn on and off depending on a QB node voltage, and output a gate low voltage by turn-on;

a node control circuit configured to control the Q node voltage and the QB node voltage to a high supply voltage or a low supply voltage; and a discharge control circuit configured to discharge the Q node voltage and the QB node voltage in response to the second logic level of the kth SR selection signal, wherein the pull-up TFT and the pull-down TFT are turned on in response to the high supply voltage of a Q node and a QB node, and turned off in response to the low supply voltage of the Q node and the QB node, and wherein the discharge control circuit includes:

a first TFT configured to discharge the Q node voltage to the low supply voltage in response to the second logic level of the kth SR selection signal; and a second TFT configured to discharge the QB node voltage to the low supply voltage in response to the second logic level of the kth SR selection signal.

18. The display device of claim 17, wherein a gate electrode of the first TFT is coupled to a SR selection signal input terminal which the kth SR selection signal is input to, a source electrode thereof is coupled to a low supply voltage terminal which the low supply voltage is supplied to, a drain electrode thereof is coupled to a Q node, and wherein a gate electrode of the second TFT is coupled to the SR selection signal input terminal, a source electrode thereof is coupled to the low supply voltage terminal, a drain electrode thereof is coupled to a QB node.

* * * * *